United States Patent [19]

Briefer

[11] 4,054,833
[45] Oct. 18, 1977

[54] CAPACITANCE MEASURING SYSTEM

[75] Inventor: Dennis K. Briefer, Berlin, Mass.

[73] Assignee: Setra Systems, Inc., Natick, Mass.

[21] Appl. No.: 695,026

[22] Filed: June 11, 1976

[51] Int. Cl.$^2$ .................... G01R 11/52; G01R 27/26
[52] U.S. Cl. ................................................ 324/60 C
[58] Field of Search ............ 324/60 C, 60 CD, 60 R, 324/61 QL, 61 QS, 61 R; 73/304 C; 307/109, 110; 317/246

[56] References Cited

U.S. PATENT DOCUMENTS

| | | | |
|---|---|---|---|
| 3,165,694 | 1/1965 | Young | 324/60 CD X |
| 3,307,398 | 3/1967 | Exon | 73/304 C |
| 3,497,801 | 2/1970 | Clower et al. | 324/60 R |
| 3,534,606 | 10/1970 | Stamler et al. | 73/304 C |
| 3,543,046 | 11/1970 | Tiffany | 73/304 C X |
| 3,553,575 | 1/1971 | Shea | 324/61 |
| 3,824,459 | 7/1974 | Uchida | 324/60 CD |
| 3,886,447 | 5/1975 | Tanaka | 324/60 CD |

Primary Examiner—John Kominski
Assistant Examiner—Vincent J. Sunderdick
Attorney, Agent, or Firm—Kenway & Jenney

[57] ABSTRACT

A system for generating a signal which is a predetermined function of the capacitance of a sensor capacitor. The system comprises a sensing network including two series capacitors, at least one being the sensor capacitor. The system further comprises a switching network, and a feedback network coupled to the sensing and switching networks. The feedback network generates a feedback signal representative of the difference in charge stored on the series capacitors from a predetermined value. The switching network cyclically interconnects the feedback and sensor networks with the feedback signal and externally applied reference potentials whereby the average charge stored on the series capacitors over each cycle is substantially equal to the predetermined value. In some embodiments, the feedback signal is a linear function of the reciprocal of capacitance of the sensor capacitor.

25 Claims, 9 Drawing Figures

CAPACITANCE MEASURING SYSTEM

BACKGROUND OF THE INVENTION

This invention relates to measurement systems, and more particularly, to capacitance measurement systems.

Many forms of prior art capacitance measurement systems utilize a capacitive bridge configuration to produce a signal representative of the relative capacitances associated with sensor and reference capacitors in the bridge. Other forms in the prior art include systems exemplified by U.S. Pat. No. 3,048,775 wherein a capacitive sensor is configured in the feedback path around an a.c. amplifier driven by a reference a.c. signal, and wherein the amplifier output is demodulated using a diode detector.

While such prior art capacitance measurement systems are suited for certain uses as accelerometers, scales and balances, proximity detectors, linear and angular position sensors, and pressure transducers, the prior art systems are substantially limited in accuracy and sensitivity of their respective measurements due to a number of factors, including temperature variation, stray or leakage capacitance, nonlinearities in the transducer configurations, noise, and drift. Furthermore, many prior art systems are limited to certain operational frequencies.

It is an object of the present invention to provide a capacitance measuring system wherein a signal is generaged which is a predetermined function of the capacitance of a sensor capacitor.

A further object is to provide a capacitance measuring system which is relatively insensitive to temperature variation, stray or leakage capacitance, noise, drift and operational frequency.

SUMMARY OF THE INVENTION

According to the present invention, a sensor network, including series connected capacitors is utilized with a switching network in a feedback configuration to generate the signal which is a predetermined function of the capacitance of the sensor capacitor. In one form of this invention, the feedback signal is a linear function of the reciprocal of the capacitance of the sensor capacitor. In another form, the feedback signal is a linear function of the capacitance of the sensor capacitor.

The switching network includes a two state switch and a control for cyclically controlling the switch to flip between its two states. A means is provided to couple a plurality of reference potentials to various terminals of the switch, to the feedback network, and in some embodiments to the sensor network.

The feedback network is coupled to both the sensor and switching networks, and provides a feeback signal representative to the difference in charge stored on the series capacitors from a predetermined value.

The switching network is operative to cyclically interconnect the feedback network and sensor network with the feedback signal and external reference potentials in a manner whereby the average charge stored on the series capacitors over each cycle is substantially equal to the predetermined value.

In one form of the invention, the feedback network includes a differential amplifier coupled to the junction of the series capacitors in a null-seeking configuration. Additionally, the amplifier output may be directed by way of a demodulator to provide the feedback signal. The demodulator is such embodiments may be a synchronous demodulator, operating synchronously with the switch control in the switching network.

In null-seeking configurations, the feedback nulling of the error signal at the junction between the sensor and reference capacitors virtually eliminates the effect of any leakage capacitance which might be present. As a result, such configurations may readily be utilized with a remote sensor.

Furthermore, by using conventional techniques for the switching network and synchronous demodulator, the system operates as a sampled data system with the result that noise at frequencies other than the sampling frequency is virtually eliminated, making the system in accordance with the present invention relatively low noise compared with systems of the prior art. In addition, the temperature sensitivities associated with prior art systems, such as generated by temperature dependent gain factors, or by diode detection networks are not present in the present system.

Additionally, the feedback network may include a differential amplifier which is a.c. coupled to the junction point between the series capacitors so that the system operates to seek a dynamic null. As a result, such systems may be constructed with relatively inexpensive circuit elements since a high performance d.c. amplifier (exhibiting relatively high gain stability and low drift) is not required.

BRIEF DESCRIPTION OF THE DRAWINGS

The foregoing and other objects of this invention, the various features thereof, as well as the invention itself, may be more fully understood from the following description, when read together with the accompanying drawings in which.

DESCRIPTION OF THE PREFERRED EMBODIMENT

Figure 1:
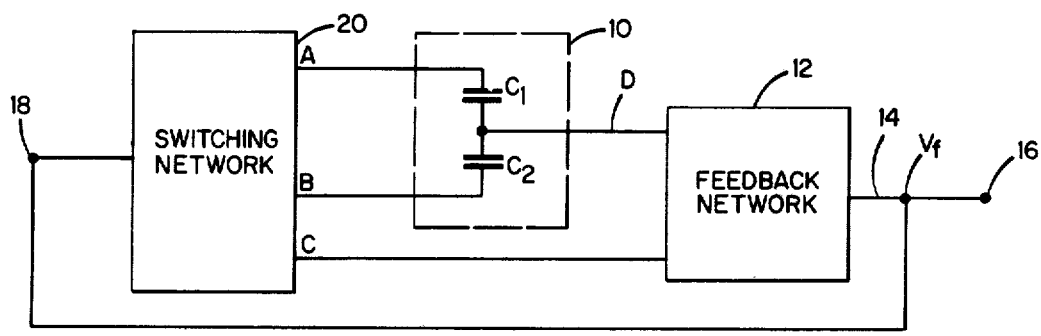
FIG. 1 shows, in block diagram form, a capacitance measuring system according to the present invention.

FIG. 1 illustrates an exemplary embodiment of the present invention in block diagram form. In that figure, a sensor network 10 includes a pair of series connected capacitors $C_1$ and $C_2$. The junction point between these capacitors is connected by way of signal line D as a first input to a feedback network 12. The feedback network 12 provides a feedback signal $V_f$ by way of line 14 to an output terminal 16, and by way of feedback terminal 18 to a switching network 20. Network 20 provides signal lines A and B which are connected to the sensor network 10, and signal line C which is connected as a second input to the feedback network 12.

The feedback network 12 includes a means to generate a feedback signal representative of the difference in the charge stored on the series capacitors $C_1$ and $C_2$ from a predetermined value. The switching network includes a control which is operative to cyclically interconnect the feedback terminal 18 and a plurality of externally applied reference potentials with the sensor network 10 and the feedback network 12 by way of lines A, B and C, whereby the average charge stored on the capacitors $C_1$ and $C_2$ over each cycle is substantially equal to the predetermined value. In this configuration, the feedback signal is a predetermined function of capacitance of one of the capacitors $C_1$ and $C_2$.

Figure 2:
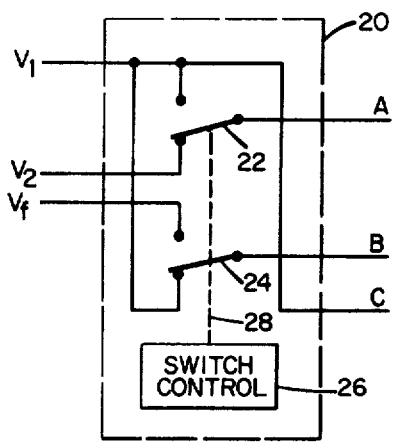
FIGS. 2–4 shows, in schematic form, alternative switching networks for the system of FIG. 1.
Figure 3:
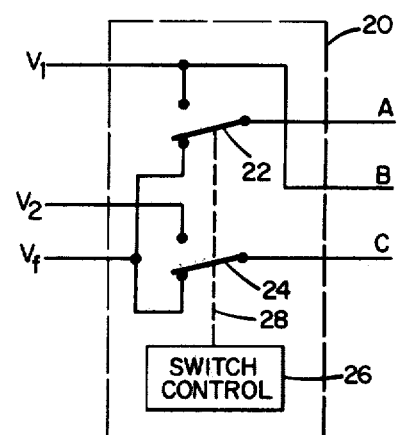
Figure 4:
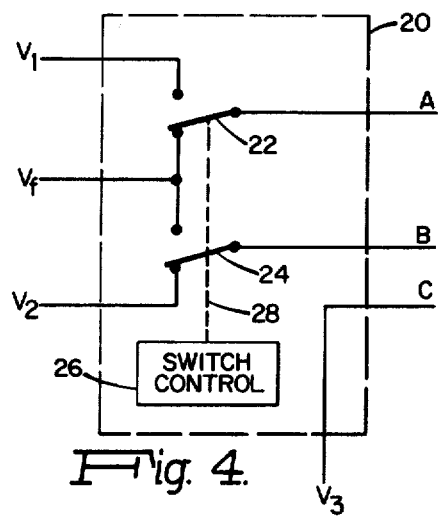

FIGS. 2-4 show, by way of example, alternative forms for the switching network 20 which are suitable for use in the configuration of FIG. 1. Each of the illustrated switching networks include a double pole, double throw switch (including coupled switches 22 and 24) and a switch control 26. The switch coupling is indicated by the dashed line 28 in these figures. It will be understood that double pole, double throw switch may take the form of a solid state switching element, for example, using a conventional FET configuration. Alternative forms of the double pole, double switch may be readily substituted in keeping with the present invention.

The reference potentials $V_1$ and $V_2$ (as shown in FIGS. 2-4) and potential $V_3$ (as shown in FIG. 4) are coupled to the various terminals of the switches and signal lines A. B. and C. This coupling is illustrated by the solid lines, indicative of a reference potential coupling means.

Figure 5:
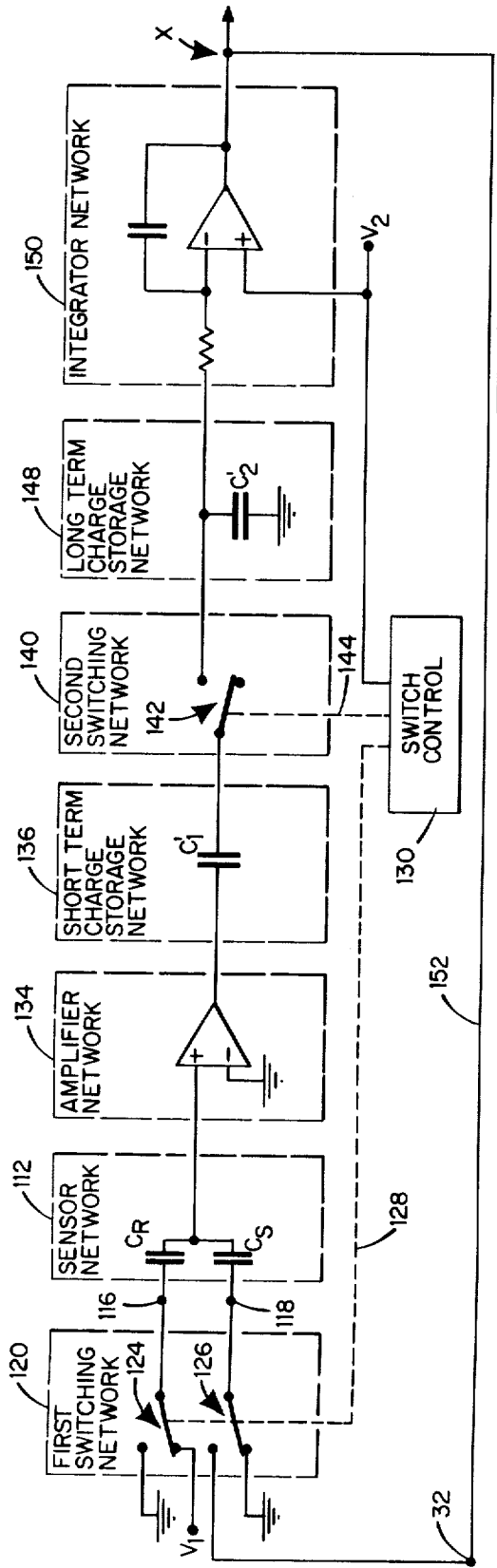
FIG. 5 shows, in schematic form, an exemplary configuration of a capacitance measure system in accordance with the present invention.
Figure 8:
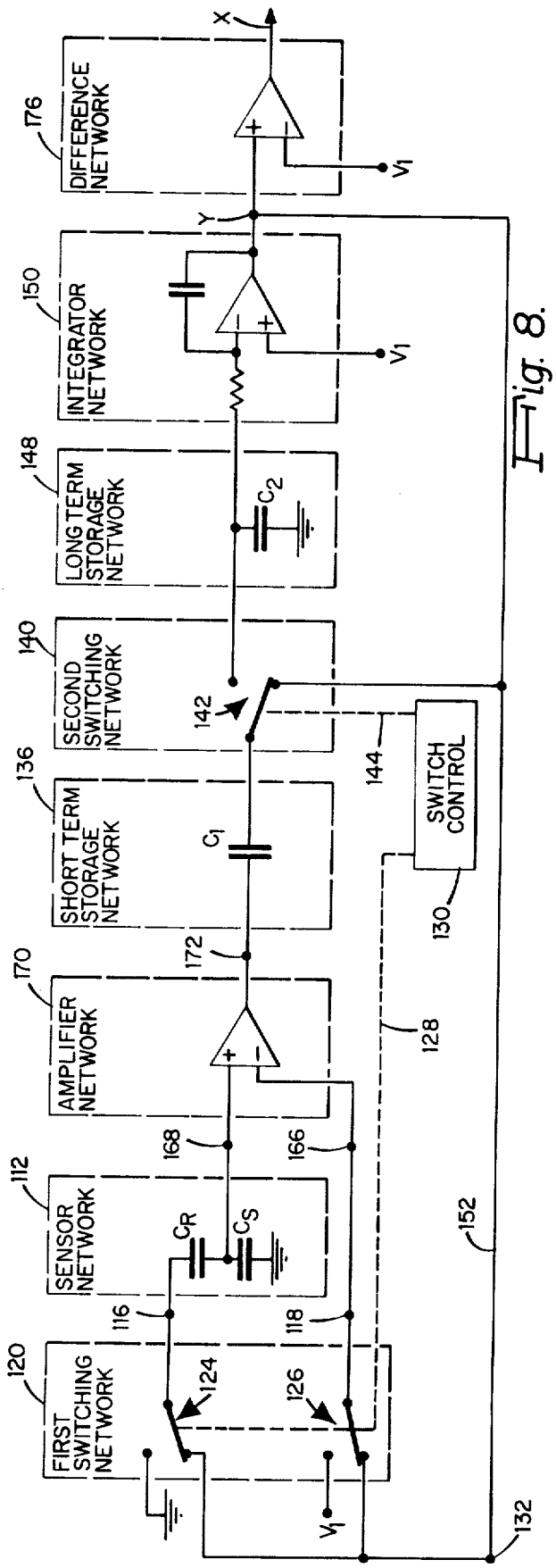
FIG. 8 shows, in schematic form, an alternative configuration for a capacitive measuring system in accordance with the present invention.

Switch control 26 may be any suitable means for driving the switches 22 and 24 together. In alternative embodiments, such as illustrated in FIGS. 5 and 8, the switch control 26 may be further coupled to the feedback network 12, as described more fully below, to permit synchronous demodulation in the feedback network.

With each of the switching, networks of FIGS. 2-4, the switching elements 22 and 24 are cyclically switched so that their poles are alternately connected between their associated terminals so that the configuration of FIG. 1 maintains an average charge stored on the series capacitors $C_1$ and $C_2$ over each cycle substantially equal to the predetermined value. In this configuration, the signal at the junction of the capacitors $C_1$ and $C_2$ is representative of an error signal corresponding to the difference in charge stored on those capacitors from a predetermined value.

In a configuration using the switching network 20 illustrated in FIG. 2, a feedback network 12 may include a demodulator for extracting the error signal from the signal on signal line D. As more specifically illustrated in conjunction with FIGS. 5 and 8 below, the demodulator may be operated in synchronism with the switching of switches 22 and 24. In addition, with this configuration, the network 12 may include a differential amplifier input having its differential input terminals connected to lines C and D. With the reference potential $V_1$ being maintained at ground potential, the feedback is then effective to operate in a null-seeking mode. In this configuration with $C_1$ being a fixed capacitor and $C_2$ being a variable capacitor having capacitance which varies with an external parameter (such as ambient pressure), a substantially constant average charge over a cycle is maintained on the capacitor $C_1$, while the feedback voltage $V_f$ is varied by the network 12 with the variations in the capacitance of capacitor $C_2$ in order to maintain the average charge over a cycle on capacitor $C_2$ to equal a constant. Thus, the feedback signal $V_f$ is a linear function of the reciprocal of that capacitance (i.e. $C_2$). Where $C_2$ is substantially a parallel plate capacitor, $V_f$ is a linear function of the gap between the plates of $C_2$.

For a configuration using the switching network 20 illustrated in FIG. 3, the feedback network 12 may include a differential amplifier having its differential input terminals connected across lines B and C. With this configuration, as with that described above, a demodulator may also be used in the feedback network and this demodulator may similarly be a synchronous demodulator. In operation where $C_1$ is fixed and $C_2$ varies with an external parameter, the switching network maintains as average charge on capacitor $C_1$ which is constant over a cycle,, while the feedback network 12 varies feedback voltage $V_f$ with changes in the capacitance of capacitor $C_2$ so that the average charge on capacitor $C_2$ is also maintained at a constant. Thus, in this configuration also, the feedback signal $V_f$ is a linear function of the reciprocal of the capacitance of sensor capacitor $C_2$.

With the switch network 20 configuration of FIG. 4, the potential $V_3$ is maintained between the potentials $V_1$ and $V_2$. For one null-seeking configuration, the voltages $V_1$ and $V_2$ may be of opposite polarity while the voltage $V_3$ is maintained at ground potential. In this configuration, the lines D and C may be connected across the differential inputs of a differential amplifier in network 12 in a manner similar to that described in conjunction with the FIG. 2 configuration. The system of FIG. 4 is particularly well suited for use with a differential capacitor forming the series capacitors $C_1$ and $C_2$. For example, this differential capacitor may have two fixed plates connected to terminals A and B, respectively, while the terminal D is connected to a conductive diaphragm which positioned between the fixed plates and is sensitive to an external parameter, such as pressure. In this configuration, the charge on the fixed plates is maintained equal to a predetermined constant, while the feedback network 12 varies the feedback potential $V_f$ with changes in position of the diaphragm so that a constant average charge is maintained on each of the effective capacitors formed by the differential capacitor (i.e., one formed by the fixed plate and the diaphragm ($C_1$), and the other formed by the other fixed plate and the diaphragm ($C_2$).

In all of the above described configurations, the feedback network 12 may be coupled to the junction between capacitors $C_1$ and $C_2$ by an a.c. coupling means, thereby permitting operation under dynamic null-seeking conditions, limiting the effects of drift and gain instability in the feedback network 12. FIGS. 5-9 illustrate in schematic form more detailed forms of the present invention consistent with the configurations described above in FIGS. 1-4.

In FIG. 5, a sensor network 112 is shown to include a fixed reference capacitor $C_R$ and sensor capacitor $C_S$ connected in series between input terminals 116 and 118.

A first switching network 120 is connected to terminals 116 and 118 and includes switches 124 and 126. Switches 124 and 126 are controlled to synchronously switch between two operative states in response to a control signal on line 128 provided by a switch control 130. In their first state, the switch 124 connects terminal 116 to a first reference potential $V_1$ and switch 126 connects terminal 118 to ground potential. In their second state, switch 124 connects terminal 116 to ground potential and switch 126 connects terminal 118 to a feedback terminal 132. The switches in network 120 may be in the form of conventional electronic switches such as provided by CMOS circuitry well known in the art, with the control line 128 providing the control signal for switching the CMOS switches.

The junction point between the reference capacitor $C_R$ and the sensor capacitor $C_S$ is connected by way of a.c. amplifier network 134 and short term charge storage network 136 to a second switching network 140. As illustrated in FIG. 5, network 136 includes a short term charge storage capacitor $C_1'$.

The second switching network 140 includes a switch 142 whose state is controlled by switch control 130 as indicated by the broken line 144. With switch 142 in its second state, the short term charge storage capacitor $C_1''$ is connected to a second reference potential $V_2$. In its first state, switch 142 connects capacitor $C_1'$ of the short term charge storage network 136 to a long term charge storage network 148, which comprises a long term storage capacitor $C_2''$ having one terminal at ground potential. The second switching network 140 may comprise an electronic switch network including a CMOS switch connected in series with an FET analog gate, as described below in more detail in conjunction with FIG. 6.

The long term charge storage capacitor $C_2'$ is further connected to integrator network 150 which comprises an operational amplifier configured as an integrator, whereby the output signal, X, is proportional to the time integral of the difference between the voltage across capacitor $C_2'$ and the second reference potential. The output signal X of network 150 is applied by way of feedback line 152 to the feedback terminal 132.

In the embodiment of FIG. 5, the switch control 130 includes a means for generating appropriate control signals on lines 128 and 144 to repetitively control the states of switching networks 120 and 140 so that during a first portion of each cycle, switches 124, 126 and 142 are effectively in their so-called first state (as shown in FIG. 5), and during a second portion of each cycle, those switches are in their respective second states.

Figure 6:
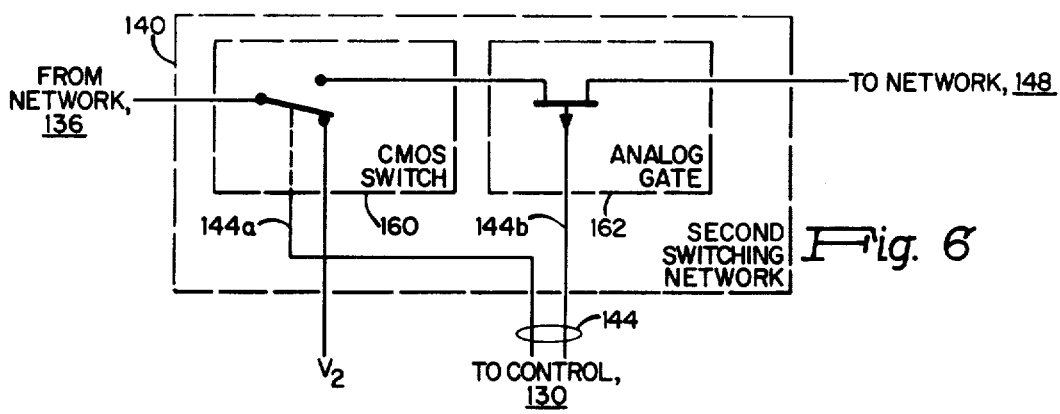
FIG. 6 shows, in schematic form, an exemplary configuration for the second switching network in the system of FIG. 5.
Figure 7:
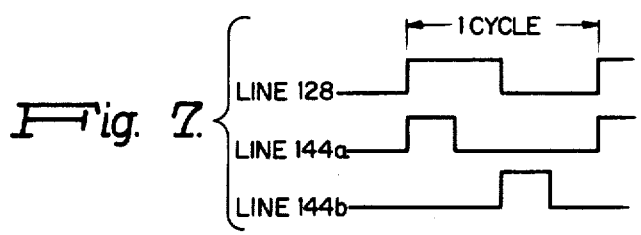
FIG. 7 shows waveforms suitable for controlling the switching networks for the system of FIGS. 5 and 6.

FIG. 6 illustrates one embodiment of the second switching network 140 which includes a CMOS switch 160 and an FET analog gate 162, respectively controlled by switch control 130 by way of line 144a and 144b. FIG. 7 illustrates exemplary signals representative of those which may be applied to lines 128, 144a and 144b, respectively, to provide the above-specified switching action of the networks 120 and 140. In response to application of the high level of the waveforms of FIG. 7, switches 124, 126, 160 and 162 enter and remain in their respective first state for the duration of that level, i.e., CMOS switches 124, 126 and 150 are in the positions illustrated in FIGS. 5 and 6, and the FET of gate 162 provides a relatively low impedance path between its source and drain. In response to application of the low level, the switches 124, 126, 160 and 162 enter and remain in their respective second state for the duration of that level, i.e. CMOS switches 124, 126 and 160 are in their non-illustrated position, and the FET of gate 162 provides a relatively high impedance path between its source and drain.

In operation, with the switch networks 120 and 140 in their first state, the reference and sensor capacitors produce an error signal at the junction point of those capacitors which serves to charge the short term charge storage capacitor $C_1'$. During the second portion of the cycle with the switch networks in their second states, the charge on the short term capacitor is transferred to the long term storage capacitor, and the voltage across that capacitor is integrated and fed back through the first switching network and sensor network. This feedback signal tends to null the a.c. signal at the junction point of the reference and sensor capacitors. At null, the feedback signal produced by the integrator network is proportional to the reciprocal of the capacitance of the sensor capacitor.

Of course, it is readily apparent that the present invention is well suited for many alternative uses which may utilize a signal which is a linear function of the capacitance of a sensor capacitor. Such uses include, for example, scales and balances, proximity detectors, pressure transducers, and linear and angular position sensors.

Figure 9:
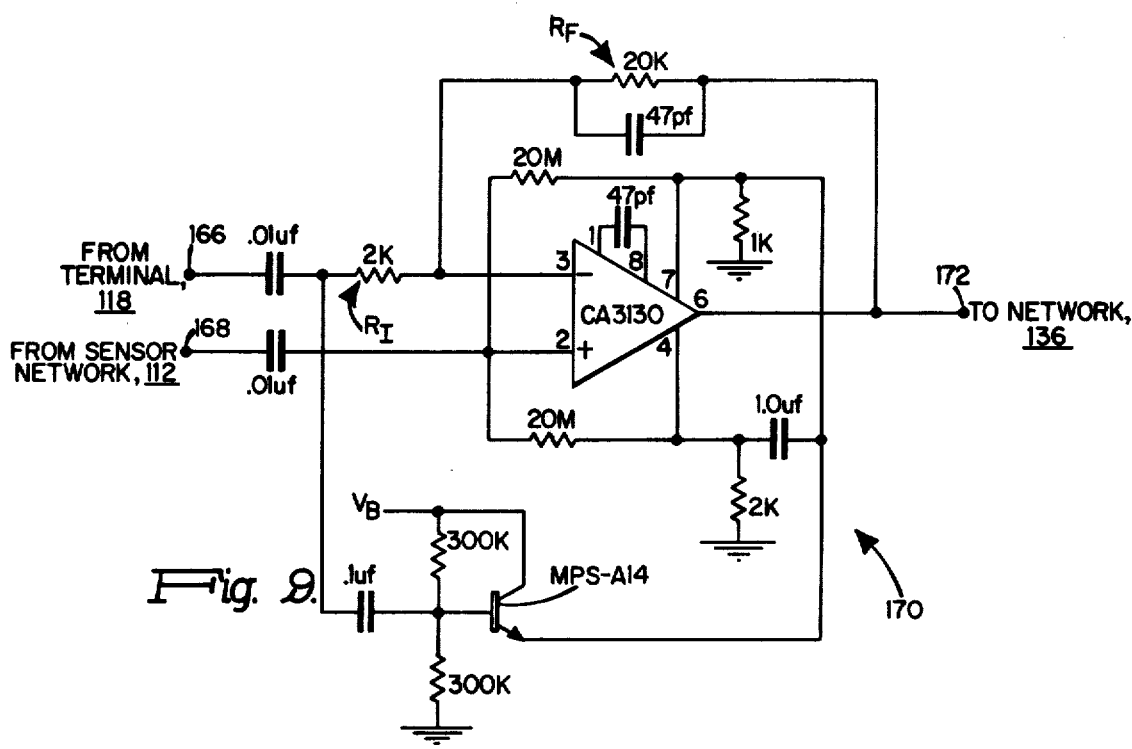
FIG. 9 shows, in schematic form, an exemplary configuration for the amplifier in the system of FIG. 8.

An alternative embodiment of the present invention is illustrated in FIGS. 8 and 9. In those figures, elements having corresponding elements in FIGS. 5 and 6 are identified with identical reference numerals.

In FIG. 8, a first switching network 120 includes SPDT switches 124 and 126 having their respective poles connected to terminals 116 and 118. Switches 124 and 126 are controlled to simultaneously switch between two operative states in response to a control signal on line 128 provided by a switch control 130. In a first state, switches 124 and 126 connect terminals 116 and 118 to feedback terminal 132. In a second state, the switch 126 connects terminal 118 to a first reference potential $V_1$ and switch 124 connects terminal 116 to ground potential. The switches in network 120 may be in the same form described above in conjunction with network 120 in FIG. 5, with the control line 128 providing the control signal for simultaneously switching the switches 124 and 126.

A sensor network 112 is shown in include a reference capacitor $C_R$ and sensor capacitor $C_S$ connected in series between terminal 118 and ground potential. The junction point between the reference capacitor $C_R$ and the sensor capacitor $C_S$ is connected to non-inverting input terminal 168 of an amplifier network 170. An inverting input terminal 166 of amplifier network 170 is connected to terminal 118.

The amplifier network 170 includes means to provide an output signal at terminal 172 which includes a first additive component porportional to the difference in the a.c. signals at the inverting and non-inverting terminals, and a second additive component proportional to the a.c. signal at the inverting terminal. An exemplary embodiment for network 170 is shown in FIG. 9 wherein a type CA3130 operational amplifier is configured with its power supply input terminals (i.e., terminals 4 and 7 in FIG. 9) being maintained at a nominal bias level (i.e., approximately $(+V_B/2)$ volts at pin 7, zero volts at pin 4) augmented by the a.c. signal applied to terminal 166. With this configuration, the voltage at terminal 172 equals $(R_F/R_I)$ times the difference in a.c. signals at terminals 166 and 168 less unity gain times the a.c. signal at terminal 166. Bootstrapping the operational amplifier power supply in this manner permits operation in a null seeking configuration, while permitting the sensor capacitor to have one terminal at ground potential.

The terminal 172 is connected by way of short term charge storage network 136 to a second switching network 140. As illustrated, network 136 includes a short term charge storage capacitor $C_1$.

The second switching network 140 includes a switch 142 whose state is controlled by switch control 130 as indicated by the broken line 144. With switch 142 in its second state, the short term charge storage capacitor $C_1$ is connected to the feedback terminal 132. In its first state, switch 142 connects capacitor $C_1'$ of the short term charge storage network 136 to a long term charge storage network 148, which comprises a long term storage capacitor $C_2'$ having one terminal at ground potential. The second switching network 140 may comprise an electronic switch network substantially the same as that described above in conjunction with FIG. 6.

The long term charge storage capacitor $C_2'$ is further connected to integrator network 150 which comprises an operational amplifier configured as an integrator, whereby the output signal, X, is proportional to the time integral of the different between the voltage across capacitor $C_2'$ and the reference potential $V_1$. The output signal Y of network 150 is applied by way of feedback line 152 to the feedback terminal 132.

In the embodiment of FIG. 8, the switch control 130 is substantially the same as that described above for the embodiment illustrated in FIGS. 5-7, and thus includes a means for generating appropriate control signals on lines 128 and 144 to repetitively control the states of switching networks 120 and 140 so that during a first portion of each cycle, switches 124, 126, and 142 are effectively in their so-called first state, and during a second portion of each cycle, those switches are in their respective second states. With this operation, the feedback configuration is effective to null the error signal at terminal 172, with the feedback signal Y being a linear function of the reciprocal of the capacitance of the sensor capacitor $C_S$.

In FIG. 8, the differential inputs to a difference amplifier network 176 are respectively connected to the integrator network 150 and to the reference potential. With this configuration, the output signal X from network 176 is proportional to the capacitive reactance if the sensor capacitor $C_S$.

The embodiments described in conjunction with FIGS. 5 and 8 are particularly suited for use as a parameter measuring system where the reference capacitor $C_R$ is a fixed value capacitor, while the sensor capacitor $C_S$ is characterized by a capacitance which varies with the external parameter to be measured. For example, in a pressure measuring system, the sensor capacitor $C_S$ may take the form of the dielectric capsule pressure sensing device described in U.S. Pat. application Ser. No. 671,612, filed Mar. 29, 1976. The particular sensors described therein include a pair of opposed conductive film members having a separation which varies with the pressure differential interior to and exterior to the dielectric capsule. The capacitance associated with the sensor is inversely proportional to the separation of the film members and thus the capacitance of the sensor capacitor varies directly with this separation. With the presently-described embodiment, the feedback configuration is effective to null the error signal at the junction of the sensor and reference capacitors so that the feedback signal X becomes proportional to the capacitance of the sensor capacitor $C_S$. Accordingly, the system provides a signal X which is a measure of the film separation and thus the pressure differential between the interior and exterior of the capsule.

The embodiment of FIG. 8 is also suitable for use as a parameter measuring system in a similar manner as the FIG. 5 embodiment wherein the reference capacitor $C_R$ is a fixed value capacitor, while the sensor capacitor $C_S$ is a capacitor which varies with the external parameter to be measured.

In addition to maintaining the advantages over the prior art systesm of the FIG. 5 embodiment, including insensitivity to temperature, noise, leakage, a.c. and d.c. gain charges the system of FIG. 8 has a further advantage in that the sensor capacitor is configured with one terminal connected ground potential, thereby permitting use with a broad range of sensors. Furthermore, in this configuration the terminal 166 provides a relatively low impedance path to ground while the terminal 168 provides a relatively high impedance path to ground, while both terminals 166 and 168 are maintained by the feedback network to be normally at the same voltage. As a result a shield configuration connected to terminal 166 may be used to substantially enclose the reference and sensor capacitors $C_R$ and $C_S$ to minimize any stray field effects.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

I claim:

1. A system for generating a signal which is a predetermined function of the capacitance of a sensor capacitor, comprising:
   A. a sensor network including two series connected capacitors, one of said series capacitors being said sensor capacitor,
   B. a switching network including a switch element having two states and a switch control having means to cyclically switch said switch element between said two states,
   C. reference coupling means for coupling a plurality of externally applied reference potentials to said switching element,
   D. a feedback network coupled to said sensor network and switching network, and including means to generate a feedback signal at a feedback terminal, said feedback signal being representative of the difference in charge stored on said series capacitors from a predetermined value, wherein said switching network is operative to cyclically interconnect said feedback network and sensor network with said feedback terminal and coupling means whereby the average charge stored on said series capacitors over each cycle is substantially equal to said predetermined value, said feedback signal being said predetermined function of the capacitance of said sensor capacitor.

2. A system according to claim 1 wherein said switching element comprises a double pole, double throw switch means having first and second poles connected across said series capacitors, said first pole being switched between terminals maintained by said reference coupling means at first and second reference potentials, and said second pole being switched between said feedback terminal and a terminal maintained by said reference coupling means at said first reference potential, and wherein said feedback network is coupled to the junction between said series capacitors.

3. A system according to claim 2 wherein said feedback network is coupled to the junction between said series capacitors by way of an a.c. coupling network.

4. A system according to claim 2 wherein said double pole, double throw switch means is a solid state element.

5. A system according to claim 2 wherein said feedback network includes a demodulator coupled to said series capacitor junction and adapted to demodulate the signal produced at said junction.

6. A system according to claim 5 wherein said demodulator is coupled to said junction by a difference amplifier having a non-inverting input maintained at said first reference potential by said reference coupling means, and an inverting input coupled to said series capacitor junction.

7. A system according to claim 6 wherein said first potential is ground potential.

8. A system according to claim 5 wherein said demodulator is operative in synchronism with said cyclical operation of said switching network.

9. A system according to claim 2 wherein said first potential is ground potential.

10. A system according to claim 1 wherein said feedback network includes a difference amplifier having an inverting input terminal and a non-inverting input terminal, said inverting input terminal being coupled to the junction between said series capacitors.

11. A system according to claim 10 wherein said inverting input terminal is coupled to the junction between said series capacitors by way of an a.c. coupling network.

12. A system according to claim 10 wherein said switching element comprises a double pole, double throw switch means having a first pole connected to one of said series capacitors and a second pole coupled to said non-inverting input terminal, said first pole being switched between a terminal maintained by said reference coupling means at a first reference potential and said feedback terminal, and said second pole being switched between a terminal maintained by said reference coupling means at a second reference potential and said feedback terminal, and wherein the other of said series capacitors is coupled to a terminal maintained by said reference coupling means at said first reference potential.

13. A system according to claim 12 wherein said double pole, double throw switch means is a solid state element.

14. A system according to claim 12 wherein said feedback network includes a demodulator coupled to said difference amplifier and adapted to demodulate the signal produced by said difference amplifier.

15. A system according to claim 14 wherein said demodulator is operative in synchronism with said cyclical operation of said switching network.

16. A system according to claim 1 wherein said series capacitors comprise a differential capacitor element having two fixed plate terminals and a movable plate terminal, and wherein said switching element comprises a double pole, double throw switch means having first and second poles connected across said fixed plate terminals of said series capacitors, said first pole being switched between a terminal maintained by said reference coupling means at a first reference potential and said feedback terminal, and said second terminal being switched between said feedback terminal and a terminal maintained by said reference coupling means at a second reference potential, and wherein said feedback network is coupled to said movable plate terminal.

17. A system according to claim 16 wherein said differential capacitor element includes two fixed plates, each being connected to an associated one of said fixed plate terminals, and includes a conductive diaphragm between said fixed plates, said diaphragm being connected to said movable plate terminal.

18. A system according to claim 16 wherein said double pole, double throw switch means is a solid state element.

19. A system according to claim 16 wherein said feedback network includes a demodulator coupled to said movable plate terminal and adapted to demodulate the signal produced at said movable plate terminal.

20. A system according to claim 19 wherein said demodulator is coupled to said movable plate terminal by a difference amplifier having a non-inverting input terminal and means to maintain said non-inverting input terminal at a reference potential between said first and second reference potentials, and an inverting terminal coupled to said movable plate terminal.

21. A system according to claim 20 wherein said first and second potentials are characterized by opposite polarity, and wherein said non-inverting input terminal is maintained at ground potential.

22. A system according to claim 19 wherein said demodulator is operative in synchronism with said cyclical operation of said switching network.

23. A system for generating a signal which is a linear function of the reciprocal of the capacitance of a sensor capacitor comprising:

A. a sensor network including a reference capacitor and a sensor capacitor coupled in series between a first and second input terminal, B. a first switching network responsive to a switch control, said first switching network including means operative in a first state to connect said first input terminal to a first reference potential and said second input terminal to ground potential, and operative in a second state to connect said first input terminal to ground potential and said second input terminal to a feedback terminal, C. short term charge storage network including a capacitor having a first terminal coupled to the junction point of said reference and sensor capacitors, D. long term charge storage network including a capacitor having a first terminal connected to ground potential, E. second switching network responsive to said switch control, said second switching network including means operative in a first state to connect the second terminal of said short term charge storage capacitor to a second reference potential, and operative in a second state to connect said second terminal of said short term charge storage capacitor to the second terminal of said long term charge storage capacitor, F. means for generating a feedback signal and applying said feedback signal to said feedback terminal, said feedback signal being proportional to the integral of the difference between the voltage at said second terminal of said long term charge storage capacitor, and said second reference potential, and G. switch control means for cyclically controlling said first and second switching networks during a first portion of each cycle to be operative in said first states, and during a second portion of each cycle to be operative in said second states, whereby said feedback signal is proportional to the capacitive reactance of said sensor capacitor.

24. A system for generating a signal which is a linear function of the reciprocal of the capacitance of a sensor capacitor comprising:

A. a sensor network including a reference capacitor and a sensor capacitor coupled in series between a first input terminal and ground potential, said sensor capacitor having one terminal connected to said ground potential, B. amplifier means having an inverting input terminal, a non-inverting input terminal and an output terminal, said non-inverting input terminal being coupled to the junction point of said reference and sensor capacitors, said amplifier means including means for generating a signal at said output terminal having a first additive component which is proportional to the difference in the a.c. signals at said inverting and non-inverting terminals, and a second additive component which is proportional to the a.c. signal at said inverting terminal, C. a first switching network responsive to a switch control, said first switching network being operative in a first state to couple said first input terminal of said sensor network and said inverting input terminal to a feedback terminal, and operative in a second state to connect said first input terminal of said sensor network to ground potential and said inverting input terminal to a reference potential, D. a short term charge storage network including a capacitor having a first terminal connected to said output terminal of said amplifier means, E. a long term charge storage network including a capacitor having a first terminal connected to ground potential, F. a second switching network responsive to a switch control, said second switching network being operative in a first state to couple the second terminal of said short term charge storage capacitor to said feedback terminal, and operative in a second state to couple said second terminal of said short term charge storage capacitor to the second terminal of said long term charge storage capacitor, G. means for generating a feedback signal and applying said feedback signal to said feedback terminal, said feedback signal being proportional to the integral of the difference between the voltage at said second terminal of said long term charge storage capacitor, and said reference potential, and H. switch control means for cyclically controlling said first and second switching networks during a first portion of each cycle to be operative in said first states, and during a second portion of each cycle to be operative in said second states, whereby said feedback signal is a linear function of the capacitance reactance of said sensor capacitor.

25. The system according to claim 24 further comprising a means for generating a signal proportional to the difference of said feedback signal and said reference potential.

* * * * *